United States Patent
Chen et al.

(10) Patent No.: US 7,535,297 B2
(45) Date of Patent: May 19, 2009

(54) ARCHITECTURE AND METHOD FOR IMPROVING EFFICIENCY OF A CLASS-A POWER AMPLIFIER BY DYNAMICALLY SCALING BIASING CURRENT THEREOF AS WELL AS SYNCHRONOUSLY COMPENSATING GAIN THEREOF IN ORDER TO MAINTAIN OVERALL CONSTANT GAIN OF THE CLASS-A POWER AMPLIFIER AT ALL BIASING CONFIGURATIONS THEREOF

(76) Inventors: Xinghao Chen, 2925 Holly La., Endwell, NY (US) 13760; Yanbo Tian, 38 Constantine Pl., Apt. 56, Summit, NJ (US) 07901; Norman Scheinberg, 24 New St., South River, NJ (US) 08882

(*) Notice: Subject to any disclaimer, the term of this patent is extended or adjusted under 35 U.S.C. 154(b) by 61 days.

(21) Appl. No.: 11/711,292

(22) Filed: Feb. 27, 2007

(65) Prior Publication Data

US 2007/0200624 A1 Aug. 30, 2007

Related U.S. Application Data

(60) Provisional application No. 60/777,047, filed on Feb. 27, 2006.

(51) Int. Cl.
  $H03G\ 3/20$ (2006.01)
(52) U.S. Cl. .................................... 330/129
(58) Field of Classification Search ........... None
  See application file for complete search history.

(56) References Cited

U.S. PATENT DOCUMENTS

| | | | | |
|---|---|---|---|---|
| 6,134,430 A * | 10/2000 | Younis et al. | ............... | 455/340 |
| 6,256,482 B1 * | 7/2001 | Raab | ........................... | 455/108 |
| 6,600,369 B2 * | 7/2003 | Mitzlaff | ....................... | 330/149 |
| 6,784,740 B1 * | 8/2004 | Tabatabaei | ................... | 330/279 |
| 6,847,259 B2 * | 1/2005 | Kenington | .................. | 330/149 |
| 7,274,255 B2 * | 9/2007 | Hellberg | ...................... | 330/136 |
| 7,339,616 B2 * | 3/2008 | Mabuchi et al. | .......... | 348/220.1 |
| 7,376,206 B1 * | 5/2008 | Simic et al. | ................ | 375/329 |

* cited by examiner

Primary Examiner—Robert Pascal
Assistant Examiner—Krista M Flanagan
(74) Attorney, Agent, or Firm—Bernard S. Hoffman

(57) ABSTRACT

An architecture and method for improving efficiency of a Class-A power amplifier by dynamically scaling biasing current thereof as well as synchronously compensating gain thereof in order to maintain overall constant gain of the Class-A power amplifier at all biasing configurations thereof. A biasing-current switching-network is operatively connected to the back-end block of the Class-A power amplifier. A gain-control switching-network is operatively connected to a front-end block of the Class-A power amplifier. A detector-and-control block is operatively connected to an output of the back-end block of the Class-A power amplifier, and samples a signal that is then compared with reference signals to determine switching configurations in the biasing-current switching-network and the gain-control switching network when the signal is processed through the front-end block of the Class-A power amplifier followed by the back-end block of the Class-A power amplifier. The biasing-current switching-network dynamically sets the back-end block biasing current of the Class-A power amplifier for a highest possible operating efficiency. The gain-control network simultaneously adjusts gain of the front-end block of the Class-A power amplifier to synchronize with a dynamic-biasing current-switching configuration to allow overall gain of the Class-A power amplifier to be constant in all biasing conditions.

4 Claims, 7 Drawing Sheets

Building block of scalable PA

Control signal diagram

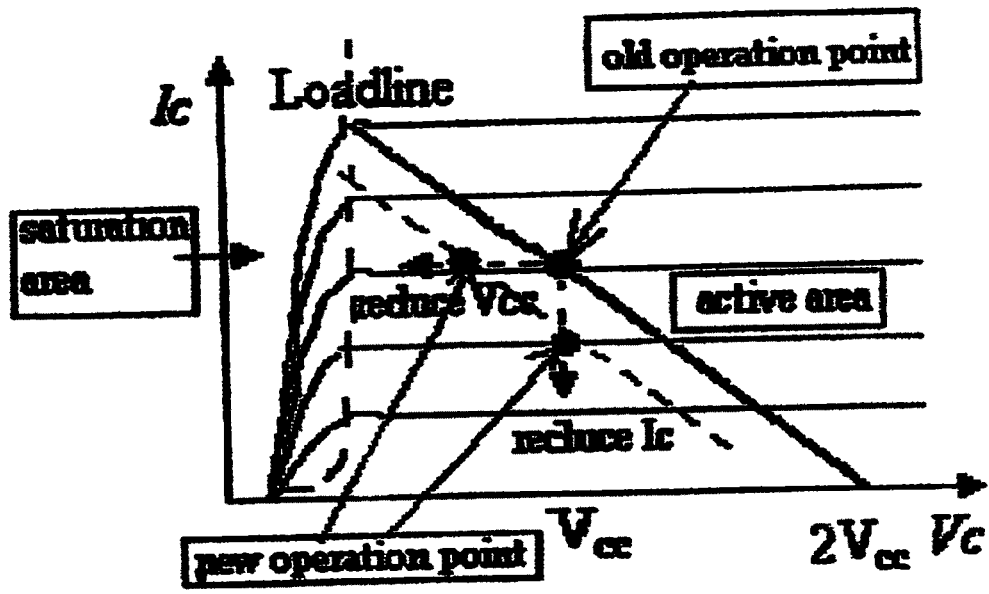
Figure 1. Two approaches to increase efficiency
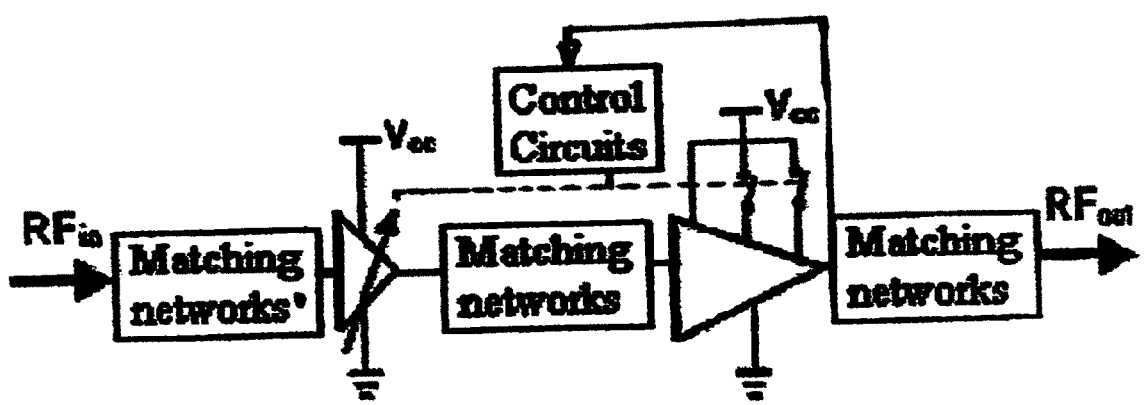
Figure 2. Building block of scalable PA

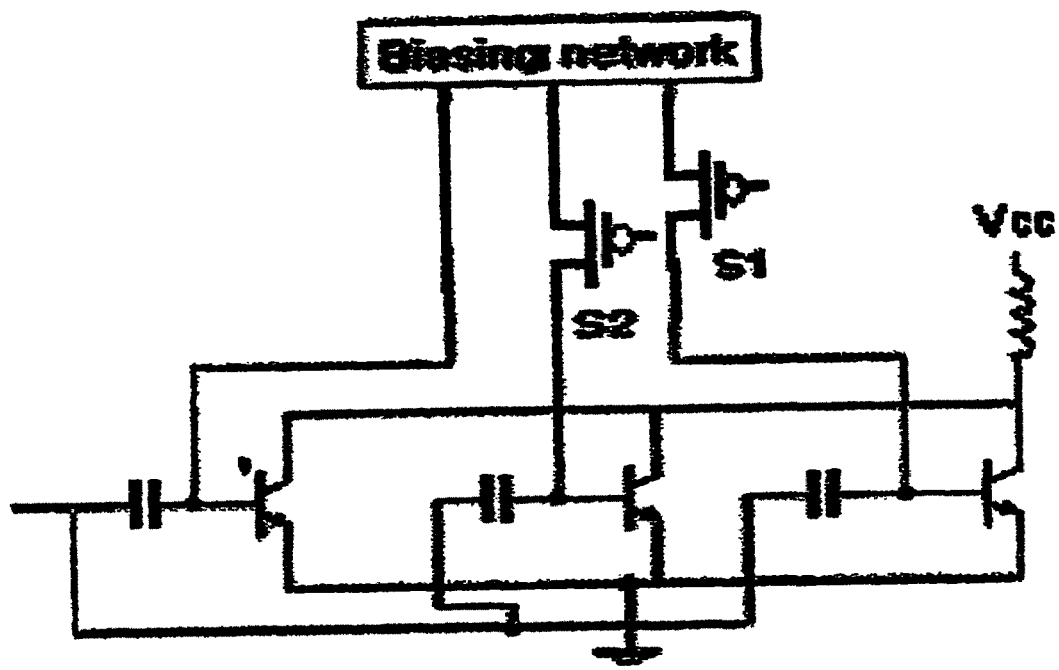
Figure 3. PA with scalable biasing current
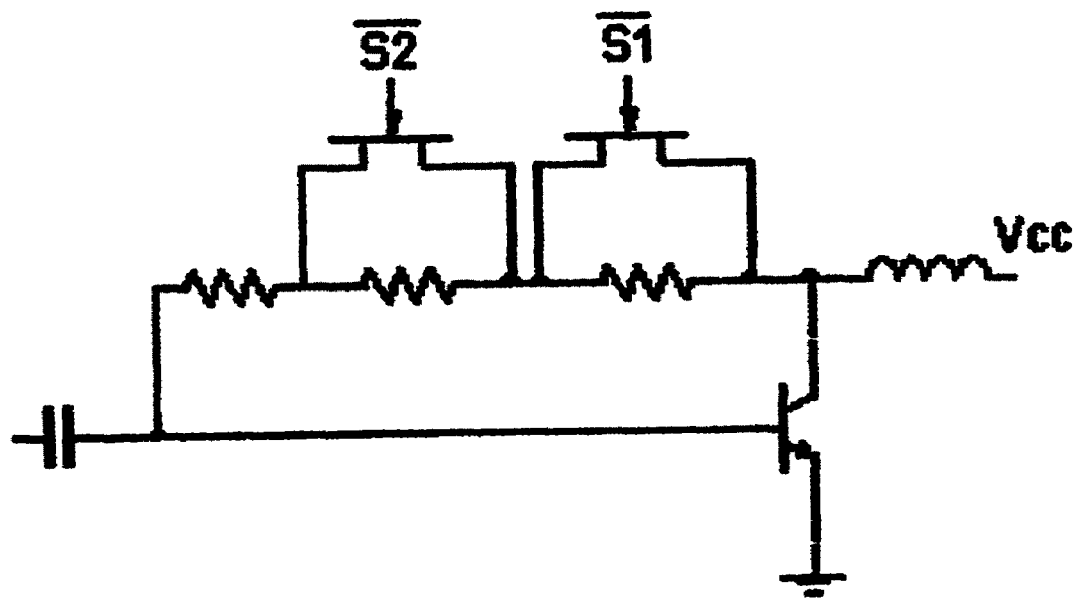
Figure 4. Dynamic gain-control network

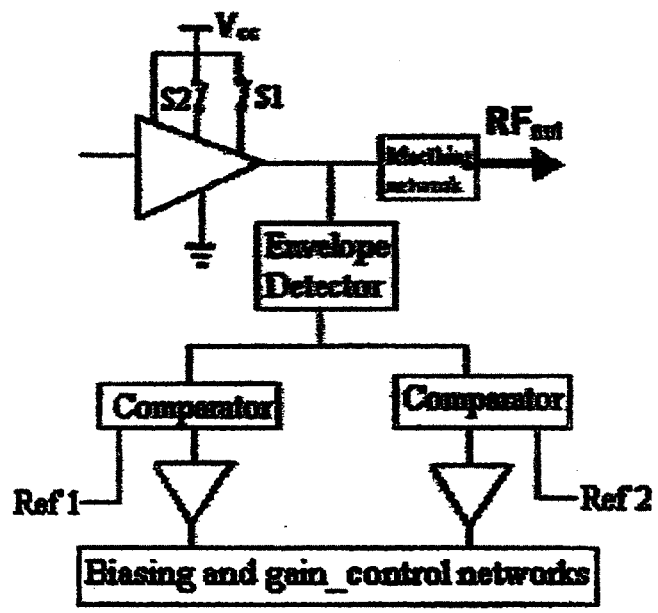
Figure 5. Control signal diagram
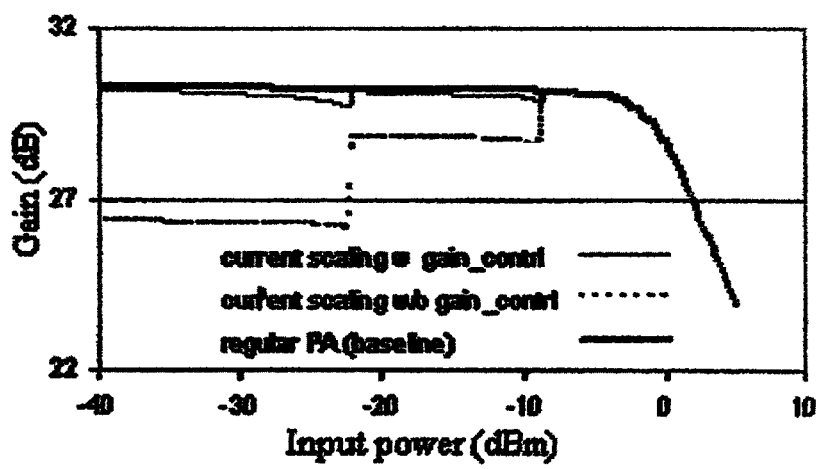
Figure 6. Gain vs. input with current-scaling configurations

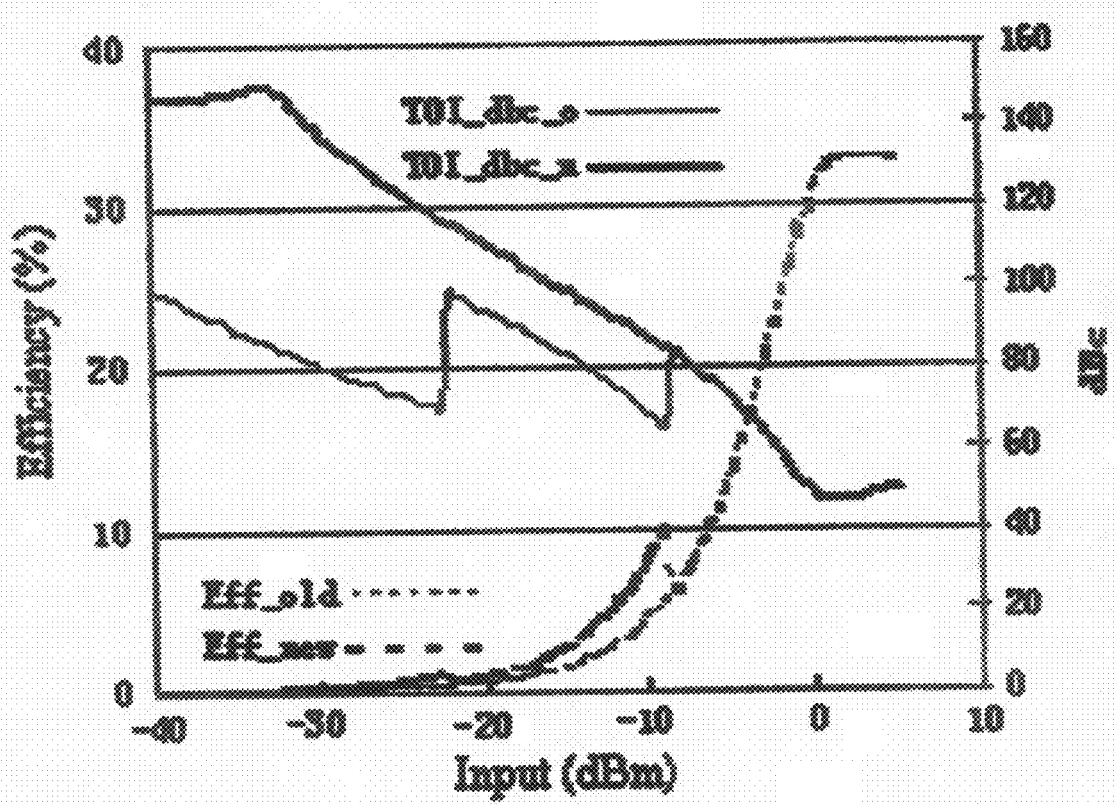
Figure 7. Efficiency and TOIMD
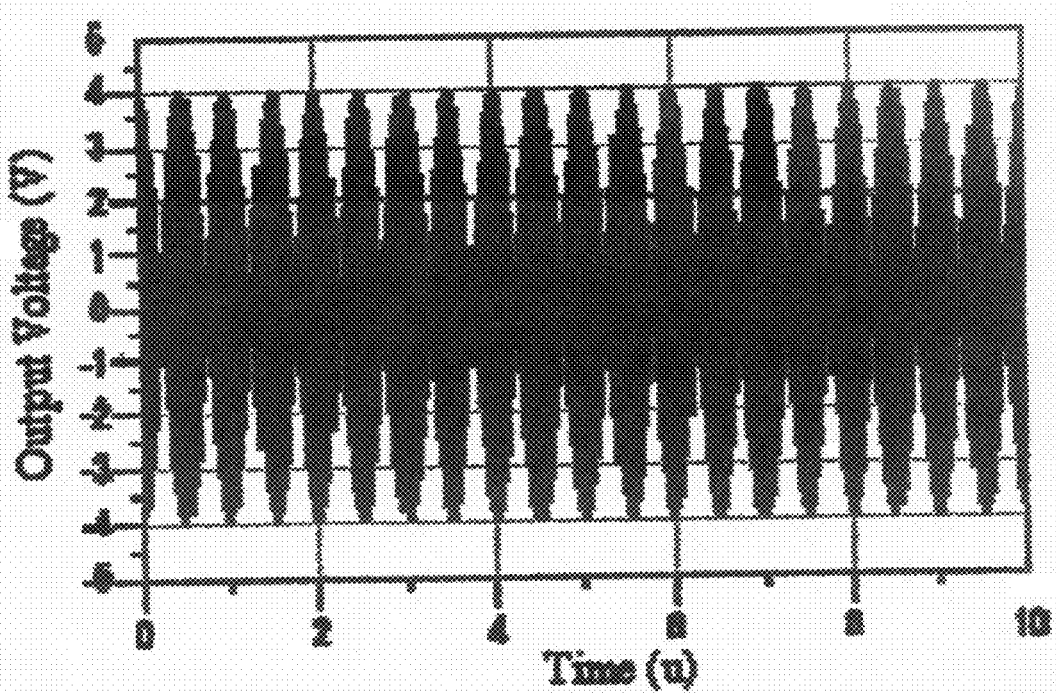
Figure 8. Output of PA without scaling

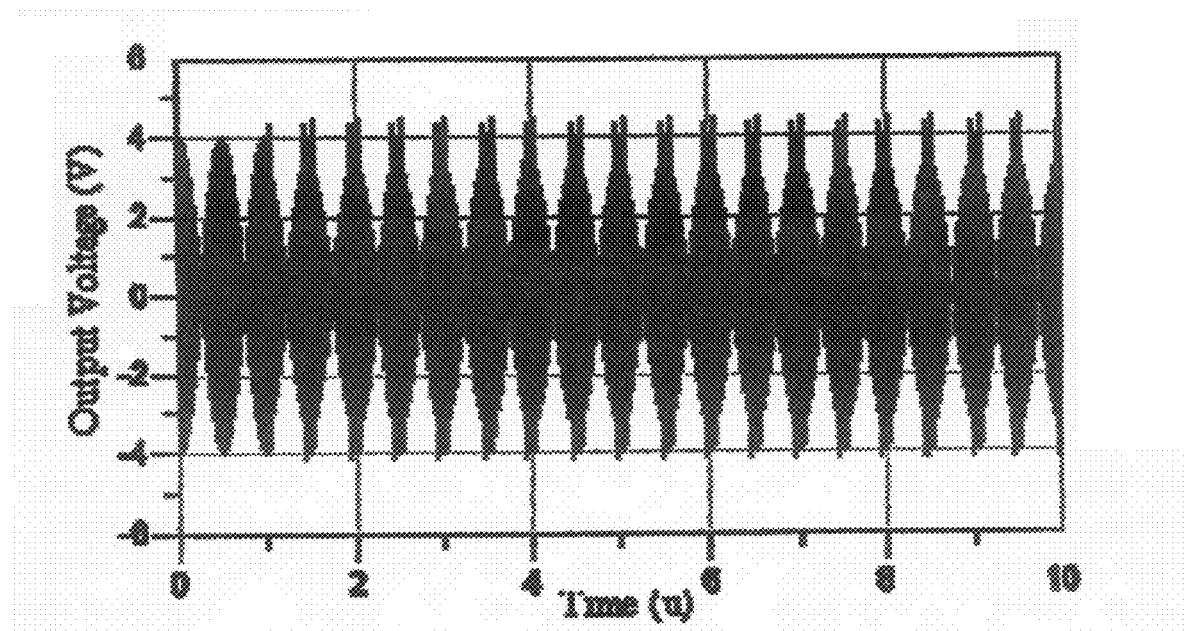
Figure 9. Output by scaled PA without gain control
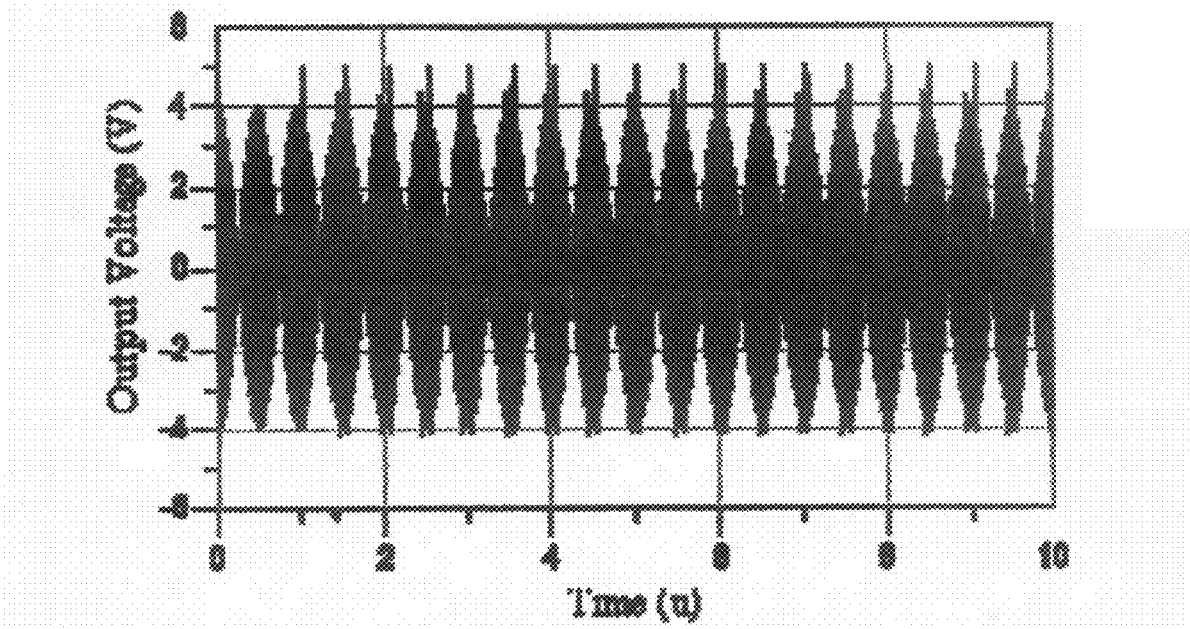
Figure 10. Output by scaled PA with gain control

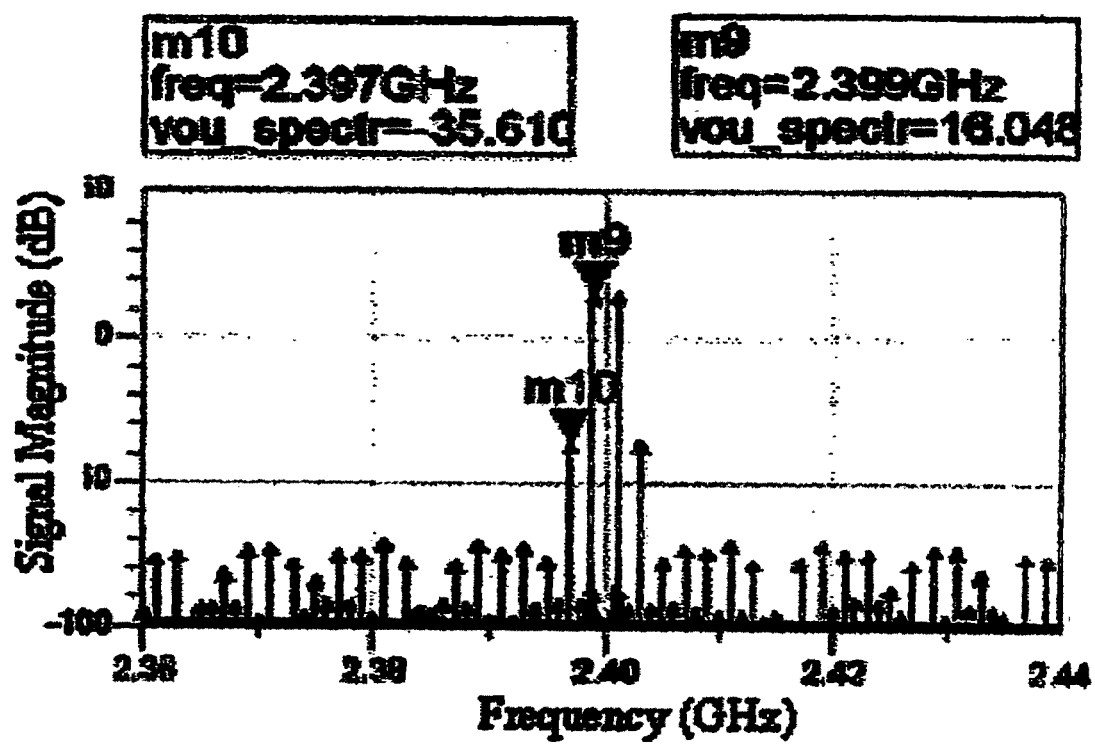
Figure 11. Spectrum of Figure 8 waveform
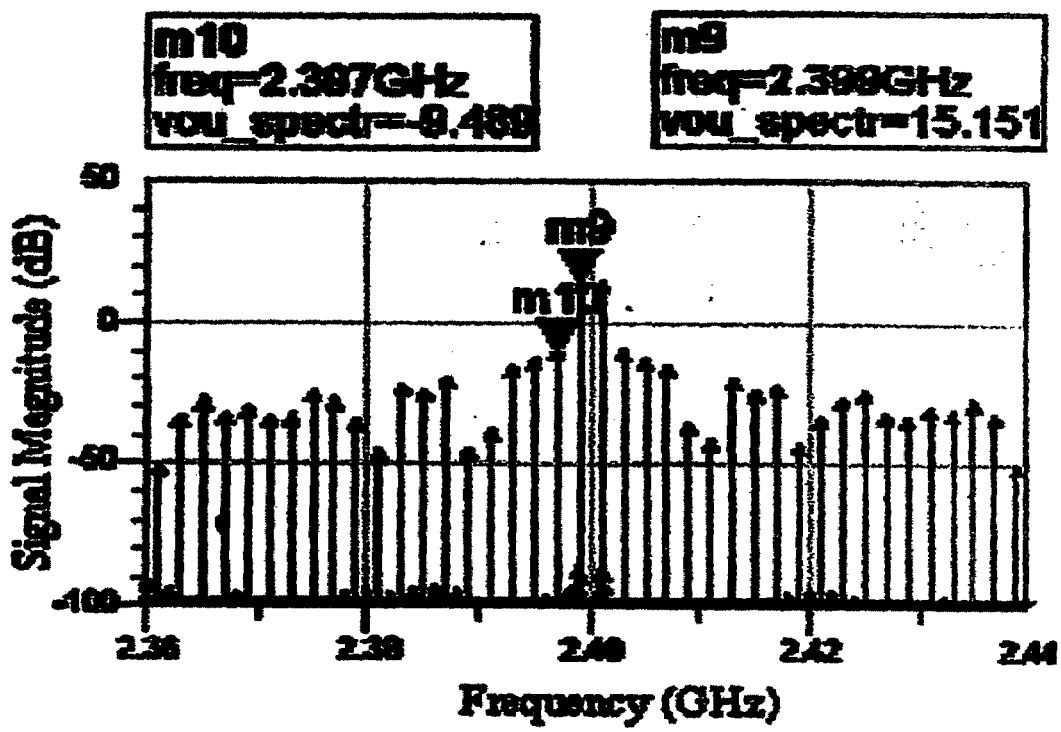
Figure 12. Spectrum of Figure 9 waveform

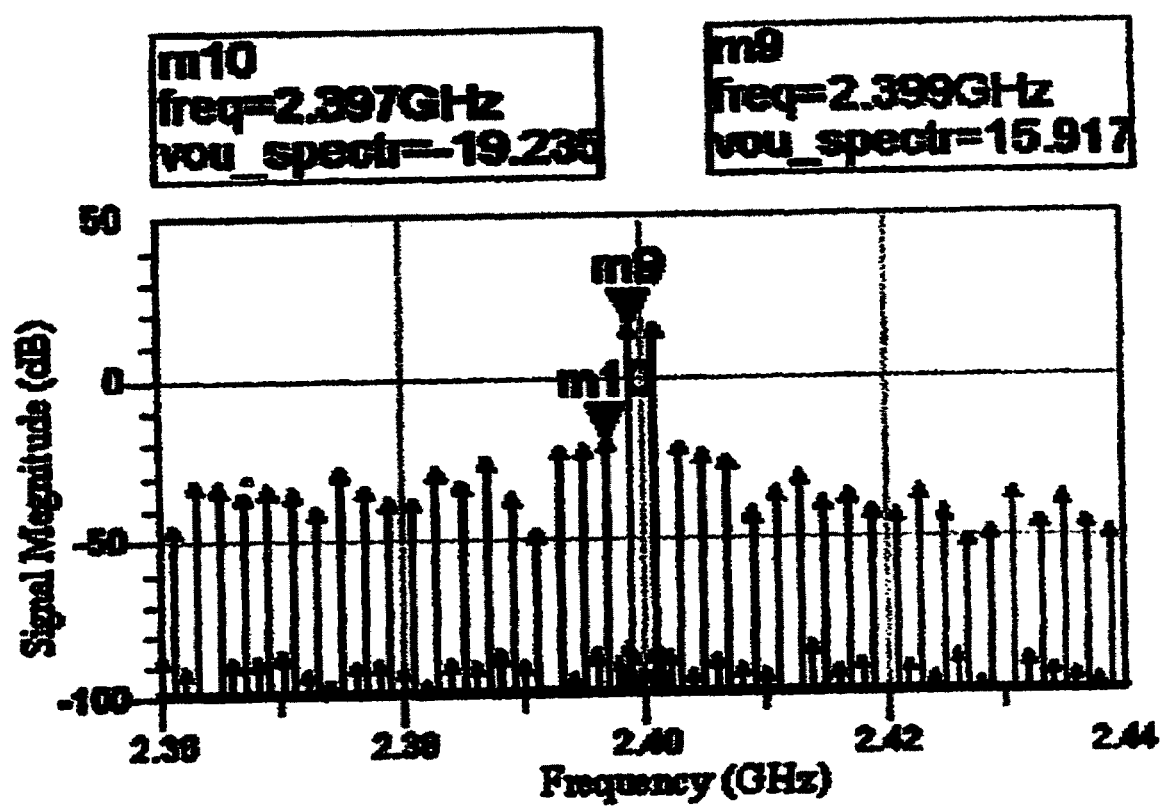
Figure 13. Spectrum of Figure 10 waveform

ARCHITECTURE AND METHOD FOR IMPROVING EFFICIENCY OF A CLASS-A POWER AMPLIFIER BY DYNAMICALLY SCALING BIASING CURRENT THEREOF AS WELL AS SYNCHRONOUSLY COMPENSATING GAIN THEREOF IN ORDER TO MAINTAIN OVERALL CONSTANT GAIN OF THE CLASS-A POWER AMPLIFIER AT ALL BIASING CONFIGURATIONS THEREOF

1. CROSS REFERENCE TO RELATED APPLICATIONS

The instant non-provisional patent application claims priority from provisional patent application No. 60/777,047, filed on Feb. 27, 2006, entitled ARCHITECTURE FOR IMPROVING EFFICIENCY OF A CLASS-A POWER AMPLIFIER BY DYNAMICALLY SCALING BIASING CURRENT AS WELL AS COMPENSATING GAIN, and incorporated herein by reference thereto.

2. BACKGROUND OF THE INVENTION

A. Field of the Invention

The embodiments of the present invention relate to an architecture for improving efficiency of a Class-A power amplifier, and more particularly, the embodiments of the present invention relate to an architecture and method for improving efficiency of a Class-A power amplifier by dynamically scaling biasing current thereof as well as synchronously compensating gain thereof in order to maintain overall constant gain of the Class-A power amplifier at all biasing configurations thereof.

B. Description of the Prior Art

Power amplifiers, which provide driving ability to antennas, are the most power-hungry components of RF transceivers and other mobile applications. Power amplifiers can be either linear, in which a transistor acts as a current source, or nonlinear, in which a transistor acts as a switch. Linear power amplifiers, such as Classes A, AB, and C, depending on the biasing points, preserve amplitude information, while nonlinear power amplifiers, such as Classes E and F, are mainly used to amplify constant envelope signals. In general, linear power amplifiers tend to have high linearity and poor efficiency, while nonlinear power amplifiers tend to have poor linearity and high efficiency (~100%).

With the fast development of wireless and mobile technologies, many applications employ non-constant envelope modulation, such as QPSK and QAM, to maximize spectrum efficiency, which requires the use of a linear power amplifier. Unfortunately, linear power amplifiers are usually not only less efficient but the efficiency drops rapidly when processing small signals. For example, although the maximum efficiency of a Class-A power amplifier is 50%, its average efficiency is typically less than 5%.[1]

[1] F. H. Raab et al., "Power Amplifiers and Transmitters for RF and Microwave," *IEEE Transactions on Microwave Theory and Techniques*, vol. 50, pp. 814-826, March 2002.

Methods, such as predistortion,[2] feedforward,[3] and envelope elimination and restoration (EER),[4] are utilized to improve linearity and average efficiency. Dawson[5] summarized their advantages and disadvantages. Other methods to improve power amplifier efficiency were also discussed.[6]

[2] Y. Zhou et al., "Performance of predistorted APK Modulation for one- and two-link nonlinear power amplifier Satellite communication channels," *Asia-Pacific Microwave Conference*, pp. 1139-1142, December 2000.

[3] W. J. Kim et al., "Ultra performance of the feedforward linear power amplifier using error feedback technique," *IEEE Transactions on Microwave Theory and Techniques*, vol. 50, pp. 814-826, March 2005.

[4] N. Wang et al., "Linearity of X-band Class-B power amplifiers in EER operation," *IEEE Transactions on Microwave Theory and Techniques*, vol. 53, pp. 1096-1102, March 2005.

[5] J. L. Dawson, "Power Amplifier Linearization Techniques: An Overview," Workshop on RF Circuits for 2.5G and 3G Wireless Systems," presented at IEEE International Solid-State Circuits Conference, Feb. 4, 2001.

[6] J. Deng et al., "A high-Efficiency SiGe BICMOS Power Amplifier with Dynamic Current Biasing for Improved Average Efficiency," *Proceedings of the IEEE Radio Frequency Integrated Circuits Symposium*, pp. 361-364, 2004; K. Yang et al., "High-Efficiency Class-A Power Amplifier with a Dual-Bias-Control Scheme," *IEEE Transactions on Microwave Theory and Techniques*, Vol. 47, No. 8, pp. 1426-1432, August 1999.

The quiescent currents of traditional Class-A power amplifiers are constant, which enables the power amplifiers to have high linearity, but poor efficiency. The power-added efficiency (PAE) is defined as Equation 1:

$$\eta_{PAE} = \frac{P_{out} - P_{in}}{V_{cc}I_c} \quad (1)$$

When input power ($P_{in}$) decreases, output power ($P_{out}$) also decreases due to constant gain. The efficiency drops as $V_{cc}I_c$ remains unchanged. Hence, when processing small inputs, power amplifiers' efficiency can be improved by reducing either the operation voltage ($V_{cc}$), the biasing current ($I_c$), or both, as indicated in FIG. 1, which is a plot of two orthogonal approaches to increase efficiency. Note that the RF choke can cause peak collector voltage swing up to $2V_{cc}$ while keeping the output within the active region. The operation point shifts to the left in the case of reducing $V_{cc}$ and move downward in the case of reducing $I_c$—the loadline slope doesn't change if load impedance is unchanged. Scaling $V_{cc}$ requires the use of a high-speed and highly-efficient DC-to-DC converter,[7] which is difficult to implement on the same die.

[7] DC-to-DC conversion refers to the technology that allows a power amplifier's power supply voltage (DC) to be adjustable/controllable (at very high frequency) according to dynamic signal strength and conditions.

Thus, there exists a need for an architecture and method for improving efficiency of a Class-A power amplifier by dynamically scaling biasing current thereof as well as synchronously compensating gain thereof in order to maintain overall constant gain of the Class-A power amplifier at all biasing configurations thereof.

3. SUMMARY OF THE INVENTION

Thus, it is an object of the embodiments of the present invention to provide an architecture and method for improving efficiency of a Class-A power amplifier by dynamically scaling biasing current thereof as well as synchronously compensating gain thereof in order to maintain overall constant gain of the Class-A power amplifier at all biasing configurations thereof, which avoids the disadvantages of the prior art.

A scalable Class-A power amplifier architecture aims at improving power amplifier's efficiency by dynamically scaling the biasing current thereof as well as compensating the gain thereof. Simulation results with two biasing current switching nodes indicate a potential for a 71% efficiency improvement as well as a 50% reduction in power consumption, with the input range near the −8 dBm level. More biasing current switching nodes can enable greater Class-A power amplifier efficiency improvements.

Briefly stated, another object of the embodiments of the present invention is to provide an architecture and method for improving efficiency of a Class-A power amplifier by dynamically scaling biasing current thereof as well as synchronously compensating gain thereof in order to maintain overall constant gain of the Class-A power amplifier at all biasing configurations thereof. The dynamically scalable Class-A power amplifier includes a front-end pre-amplifier block and a back-end power amplifier block, as illustrated in FIG. 2. A biasing-current switching-network is operatively connected to the back-end block of the Class-A power amplifier. A gain-control switching-network is operatively connected to the front-end block of the Class-A power amplifier. A detector-and-control block is operatively connected to the output of the back-end block of the Class-A power amplifier, and samples a signal that is then compared with reference signals to determine switching configurations in the biasing-current switching-network and the gain-control switching network when the signal is processed through the front-end block of the Class-A power amplifier followed by the back-end block of the Class-A power amplifier. The biasing-current switching-network dynamically sets the back-end block of the Class-A power amplifier for a highest possible operating efficiency. The gain-control network adjusts gain of the front-end block of the Class-A power amplifier to synchronize with a dynamic-biasing current-switching configuration to allow overall gain of the Class-A power amplifier to be constant in all biasing conditions.

The embodiments of the present invention themselves both as to their construction and to their method of operation together with additional objects and advantages thereof will be best understood from the following description of the specific embodiments when read and understood in connection with the accompanying drawing.

4. BRIEF DESCRIPTION OF THE DRAWING

The figures of the drawing are briefly described as follows:

FIG. 1 is a plot of two orthogonal approaches to increase efficiency;

FIG. 2 is the building blocks of a scalable power amplifier;

FIG. 3 is a power amplifier with scalable biasing current with two switching nodes;

FIG. 4 is a circuit of a dynamic gain-control network;

FIG. 5 is a detector-and-control block diagram;

FIG. 6 is a plot of gain vs. input with current-scaling configurations;

FIG. 7 is a plot of efficiency and TOIMD;

FIG. 8 is the waveform for the output of a power amplifier without scaling;

FIG. 9 is the waveform for the output of a scaled power amplifier without gain control;

FIG. 10 is the waveform for the output of a scaled power amplifier with gain control;

FIG. 11 is the spectrum of the waveform of FIG. 8;

FIG. 12 is the spectrum of the waveform of FIG. 9; and

FIG. 13 is the spectrum of the waveform of FIG. 10.

5. DETAILED DESCRIPTION OF THE PREFERRED EMBODIMENTS

A. Circuit Description

The scalable power amplifier architecture dynamically adjusts the power amplifier's biasing current in proportion to the input level. FIG. 2 shows the building block of this scalable power amplifier architecture. A power amplifier usually is implemented with many small transistors connected in parallel. This scalable architecture dynamically cuts off the biasing current to some of them as illustrated in FIG. 3, which is a power amplifier with scalable biasing current with two switching nodes. More biasing current switching node can be employed.

The control signals generated from the detector-and-control block control switches S1 and S2 in the biasing-current switching-network, which in turn determine the real-time biasing current. Change of biasing current causes change in the Class-A power amplifier's overall gain, with additional distortion and degraded signal-noise-ratio (SNR). A gain-control circuit is therefore needed to compensate gain loss due to biasing current scaling. As shown in FIG. 2, the gain of the front stage is adjustable. As shown in FIG. 4, which is a circuit of a dynamic gain-control network, two on-chip switches are used to control the feedback resistance. More switches can be employed in the gain-control switching-network to keep a synchronized configuration with the biasing-current switching-network at the back-end block to maintain the Class-A power amplifier's overall gain constant. In general, the same numbers of switches are used in the biasing-current switching-network and the gain-control network.

With large inputs, all on-chip switches in the front-end and back-end blocks are closed and the power amplifier works in full-biasing. Off-chip switches may not work due to high parasitic inductance in RF applications.

With small inputs, some of the back-end block switches are off thereby reducing the overall gain, and the switches of the front-end block open accordingly to compensate for the gain loss. FIG. 5, which is a detector-and-control block diagram, illustrates the building blocks of control signals controlling the switches in the biasing-current switching-network and the gain-control network.

Following the power amplifier's output, the envelope detector, to be implemented on the same die, picks up the baseband signal waveform. The envelope detector output feeds two comparators with preset reference voltages, which in turn control the states of switches in the biasing and gain control networks.

B. Preliminary Simulation Results

Simulation is performed with Agilent's Advanced Design System software coupled with Anadigics' ANO4 HBT process models integrating both HBT and FET on a die. The power amplifier circuit model is based on the block diagram shown in FIG. 2 integrated with biasing and gain control networks shown in FIGS. 3 and 4. The power amplifier is designed for 2.4 GHz, with a nominal gain of 30 dB and a 1-dB compression point $P_{1db}$=−2 dBm.

To simulate the dynamic effects, current scaling is set based on inputs as follows: when input is larger than −8.5 dBm, the power amplifier is configured at full-biasing configuration; when input is between −22 dBm and −8.5 dBm, the power amplifier is configured with 50% biasing thereby consuming half of the full power; and when input is less than −22 dBm, the power amplifier is configured with 25% biasing thereby consuming a quarter of the full power. FIG. 6, which is a plot of gain vs. input with current-scaling configurations, compares the gain curves with and without gain control in the current scaling configurations. It shows that the gain-control network balances the overall gain smoothly with the constant-gain curve of the full-biasing power amplifier. The dashline indicates the gain curve by current scaling without gain control to compensate for the gain loss. The power amplifier takes more gain loss when it is scaled with smaller biasing current. In real-world operation environments, the scaling schedule is to be determined by a host of performance parameters based on application requirements.

Third order inter-symbol modulation distortion (TOIMD) is used to measure a power amplifier's linearity. When the power amplifier operates from small signals towards larger signals, it improves in efficiency but degrades in linearity. This reality is reflected in FIG. 7, which shows efficiency and TOIMD with respect to input levels. For a small input range near the −9 dBm point, the scaled power amplifier consumes half of the full power. Although its TOIMD drops, it is still larger than 60 dBc.

The simulation assumes zero transition time, which is not true with real-world applications. Finite transition time incurs distortion. To study this, time-domain transient simulation is performed. Two sinusoid waveforms with 2.4 GHz central frequency and 2 MHz offset are used to simulate non-constant envelope inputs. The following Equation 2 formulates the combined input with doubled peak amplitude at some frequency.

$$\sin(\omega_0+\omega)t+\sin(\omega_0-\omega)t = 2\sin\omega_0 t \cos\omega t \qquad (2)$$

This input peaks at 6 dB below the 1-dB compression point, i.e. at −8 dBm, which is usually where a power amplifier operates in applications with large peak-to-average ratios (PAR), such as OFDM whose PAR>52. With the current scaling simulation setup stated above, there would be three configuration areas according to the input envelope level: the power amplifier is configured with 100% biasing when the input envelope level is higher than −8.5 dBm; the power amplifier is configured with 50% biasing when the input level is between −22 dBm and −8.5 dBm; and the power amplifier is configured with 25% biasing when the input level is below −22 dBm. The operation distributions of scaled configurations are 21% at 100% biasing, 67% at 50% biasing, and 12% at 25% biasing. The output time-domain waveforms thereof are shown in FIGS. 8, 9, and 10, respectively, which are, respectively, the waveform for the output of a power amplifier without scaling, the waveform for the output of a scaled power amplifier without gain control, and the waveform for the output of a scaled power amplifier with gain control. The corresponding frequency-domain spectrum analysis is shown in FIGS. 11, 12, and 13 accordingly, which are, respectively, the spectrum of the waveform of FIG. 8, the spectrum of the waveform of FIG. 9, and the spectrum of the waveform of FIG. 10, where M9 indicates the output power and M10 indicates the third-order intermodulation.

FIG. 8 shows the time-domain output waveform for the power amplifier configured at 100% biasing current without dynamic scaling. Its TOIMD is at 51.6 dBc. FIG. 9 shows the output waveform with 1 μs transition delay of the power amplifier with dynamic current scaling and without compensating the gain loss. The distortions are visible near the peaks, with TOIMD at the worst. FIG. 10 shows the output waveform with the same current scaling and with integrated gain control. Although in the time-domain it shows spikes near the peaks, the overall envelope is smoother than the case without gain control. The corresponding spectrum analysis in FIG. 13 shows that its TOIMD is more than 10 dB better than the one without gain control. The comparisons are summarized in TABLE 1 below.

TABLE 1

| | CONFIGURATION | GAIN (dB) | TOIMD (dBc) | EFFICIENCY (%) |
|---|---|---|---|---|
| 1 | Regular power amplifier | 30 | 51.6 | 6.7 |
| 2 | Current scaling with gain-control | 29.9 | 35.1 | 11.5 |

TABLE 1-continued

| | CONFIGURATION | GAIN (dB) | TOIMD (dBc) | EFFICIENCY (%) |
|---|---|---|---|---|
| 3 | Current scaling without gain-control | 29.1 | 24.6 | 11.5 |

C. The Architecture Summary

The architecture and method for improving efficiency of a Class-A power amplifier by dynamically scaling biasing current thereof as well as synchronously compensating gain thereof in order to maintain overall constant gain of the Class-A power amplifier at all biasing configurations thereof, includes a Class-A power amplifier, a biasing-current switching-network, a gain-control switching-network, and a detector-and-control block.

The Class-A power amplifier has an overall gain and includes a front-end block, and a back-end block. The back-end block of the Class-A power amplifier follows the front-end block of the Class-A power amplifier. The front-end block of the Class-A power amplifier has an adjustable gain. The back-end block of the Class-A power amplifier has an output and an adjustable biasing current.

The biasing-current switching-network is operatively connected to the back-end block biasing current of the Class-A power amplifier, and dynamically sets the back-end block of the Class-A power amplifier for a highest possible operating efficiency.

The detector-and-control block is operatively connected to the output of the back-end block of the Class-A power amplifier, and samples a signal that is then compared with reference signals to determine switching configurations in the biasing-current switching-network and the gain-control switching network when the signal is processed through the front-end block of the Class-A power amplifier followed by the back-end block of the Class-A power amplifier.

The gain-control switching-network is operatively connected to the front-end block of the Class-A power amplifier, and adjusts the gain of the front-end block of the Class-A power amplifier to synchronize with the dynamic switching configuration in the biasing-current switching-network at the back-end block to allow the overall gain of the Class-A power amplifier to be constant in all biasing conditions.

FIG. 3 depicts a circuit structure of the back-end block of the power amplifier depicted in FIG. 2 and the biasing-current switching-network thereof, with two switching nodes. More switching nodes can be employed to dynamically control biasing current with fine-gain steps.

FIG. 4 depicts a circuit structure of the front-end block of the power amplifier, aka a pre-amp, and the synchronized gain-control switching-network thereof, with two switching nodes to match with the biasing-current switching-network at the back-end block of the power amplifier. More switching nodes can be employed to synchronize with the back-end block of the power amplifier for fine-gain dynamic control.

FIG. 5 depicts the detector-and-control block at the output of the back-end block of the power amplifier. The detector-and-control block samples the output signal to form a sampled signal. The comparators thereof compare the sampled signal with reference signals and then control the switching nodes in the biasing-current switching-network at the back-end block of the power amplifier as well as the switching nodes in the gain-control switching-network at the front-end block of the power amplifier.

The power amplifier, the front-end block of the power amplifier, the biasing-current switching-network, the gain-control switching-network, the detector-and-control block and the comparators thereof are so arranged to improve operating efficiency of the power amplifier by dynamically scaling the power amplifier's biasing current thereof while maintaining its gain thereof constant, a requirement for linear amplifiers.

A classic Class-A power amplifiers includes the front-end block, aka the pre-amp, followed by the back-end block of the power amplifier, with the biasing current of the back-end block of the power amplifier fixed for a maximum output point. The interface of the embodiments of the present invention adds three additional circuit blocks to this classic Class-A power amplifier configuration.

The first is the biasing-current switching-network shown in FIG. 3 added to the back-end block of the power amplifier, the second is the gain-control switching network shown in FIG. 4 added to the front-end block of the power amplifier, and the third is the detector-and-control block shown in FIG. 5 added at the output of the back-end block of the power amplifier.

When a signal is processed through the front-end block of the power amplifier, i.e., the pre-amp block of the power amplifier, followed by the back-end block of the power amplifier, the detector-and-control block samples the signal, which is then compared with reference signals to determine switching configurations in the biasing-current switching-network and the gain-control network.

The purpose of the biasing-current switching-network is to dynamically set biasing current of the back-end block of the power amplifier for a highest possible operating efficiency. The purpose of the gain-control network is to adjust gain of the front-end block i.e., the pre-amp block of the power amplifier, to synchronize with a dynamic biasing current switching configuration to allow overall gain of the power amplifier, including the front-end block thereof and the back-end block thereof, to be constant in all biasing conditions.

D. The Method

The method for improving efficiency of a Class-A power amplifier by dynamically scaling biasing current thereof as well as synchronously compensating gain thereof in order to maintain overall constant gain of the Class-A power amplifier at all biasing configurations thereof, includes the steps of:

STEP 1: Operatively connecting a biasing-current switching-network to a back-end block of a Class-A power amplifier.

STEP 2: Operatively connecting a gain-control switching-network to a front-end block of the Class-A power amplifier.

STEP 3: Operatively connecting a detector-and-control block to an output of the back-end block of the Class-A power amplifier.

STEP 4: Processing a signal through the front-end block of the Class-A power amplifier followed by the back-end block of the Class-A power amplifier.

STEP 5: Sampling, by the detector-and-control block, a signal.

STEP 6: Comparing the signal with reference signals.

STEP 7: Determining switching configurations in the biasing-current switching-network and the gain-control network.

STEP 8: Dynamically setting, by the biasing-current switching-network, a biasing current of the back-end block of the Class-A power amplifier to a highest possible operating efficiency.

STEP 9: Simultaneously adjusting, by the gain-control network, a gain of the front-end block of the Class-A power amplifier to synchronize with a dynamic-biasing current-switching configuration to allow an overall gain of the Class-A power amplifier to be constant in all biasing conditions.

E. The Conclusions

The simulation shows that the scalable architecture, by dynamically scaling the biasing current and with dynamic gain control, improves Class-A power amplifier's efficiency by up to 71%. Theoretically, biasing-current scaling can be performed in much fine steps, such as 15% steps, so that the power amplifier operates in high efficiency over a large range of inputs. The concept of dynamic scaling demonstrated can be applied to other classes of power amplifiers as well as Class-A power amplifiers.

It will be understood that each of the elements described above or two or more together may also find a useful application in other types of constructions differing from the types described above.

While the embodiments of the present invention have been illustrated and described as embodied in an architecture and method for improving efficiency of a Class-A power amplifier by dynamically scaling biasing current thereof as well as synchronously compensating gain thereof in order to maintain overall constant gain of the Class-A power amplifier at all biasing configurations thereof, however, they are not limited to the details shown, since it will be understood that various omissions, modifications, substitutions, and changes in the forms and details of the embodiments of the present invention illustrated and their operation can be made by those skilled in the art without departing in any way from the spirit of the embodiments of the present invention.

Without further analysis, the foregoing will so fully reveal the gist of the embodiments of the present invention that others can by applying current knowledge readily adapt them for various applications without omitting features that from the standpoint of prior art fairly constitute characteristics of the generic or specific aspects of the embodiments of the present invention.

The invention claimed is:

1. An architecture for improving efficiency of a Class-A power amplifier, comprising:
   a) first means for dynamically scaling biasing current of the Class-A power amplifier by turning ON or OFF biasing current switches to individual transistors of the Class-A power amplifier;
   b) second means for synchronously compensating gain of the Class-A power amplifier by dynamically adjusting front-end pre-amplifier's gain in order to maintain overall constant gain of the Class-A power amplifier at all biasing configurations of the Class-A power amplifier; and
   c) third means for generating synchronized control signals controlling the biasing current switches of the Class-A power amplifier and gain adjusting switches of the front-end pre-amplifier by sampling output of the Class-A power amplifier in real-time with an envelope detector.

2. An architecture for improving efficiency of a Class-A power amplifier by dynamically scaling biasing current thereof as well as synchronously compensating gain thereof in order to maintain overall constant gain of the Class-A power amplifier at all biasing configurations thereof, comprising:
   a) a Class-A power amplifier;
   b) a biasing-current switching-network;
   c) a gain-control switching-network; and
   d) a detector-and-control block;

wherein said Class-A power amplifier has an overall constant gain;
wherein said Class-A power amplifier includes a front-end block;
wherein said Class-A power amplifier includes a back-end block;
wherein said back-end block of said Class-A power amplifier follows said front-end block of said Class-A power amplifier;
wherein said front-end block of said Class-A power amplifier has an adjustable gain;
wherein said back-end block of said Class-A power amplifier has an output;
wherein said back-end block of said Class-A power amplifier has an adjustable biasing current;
wherein said biasing-current switching-network is operatively connected to said back-end block of said Class-A power amplifier;
wherein said gain-control switching-network is operatively connected to said front-end block of said Class-A power amplifier;
wherein said detector-and-control block is operatively connected to said output of said back-end block of said Class-A power amplifier;
wherein said detector-and-control block samples a signal that is then compared with reference signals to determine switching configurations in said biasing-current switching-network and said gain-control switching-network when said signal is processed through said front-end block of said Class-A power amplifier followed by said back-end block of said Class-A power amplifier;
wherein said biasing-current switching-network dynamically sets said back-end block of said Class-A power amplifier for a highest possible operating efficiency; and
wherein said gain-control switching network adjusts said gain of said front-end block of said Class-A power amplifier to synchronize with a dynamic-biasing current-switching configuration to allow said overall gain of said Class-A power amplifier to be constant in all biasing conditions.

3. A method for improving efficiency of a Class-A power amplifier, comprising the steps of:
   a) dynamically scaling biasing current of the Class-A power amplifier by turning ON or OFF biasing current switches to individual transistors of the Class-A power amplifier;
   b) synchronously compensating gain of the Class-A power amplifier by dynamically adjusting front-end pre-amplifier's gain in order to maintain overall constant gain of the Class-A power amplifier at all biasing configurations of the Class-A power amplifier; and
   c) generating synchronized control signals controlling the biasing current switches of the Class-A power amplifier and gain adjusting switches of the front-end pre-amplifier by sampling output of the Class-A power amplifier in real-time with an envelope detector.

4. A method for improving efficiency of a Class-A power amplifier by dynamically scaling biasing current thereof as well as synchronously compensating gain thereof in order to maintain overall constant gain of the Class-A power amplifier at all biasing configurations thereof, comprising the steps of:
   a) operatively connecting a biasing-current switching-network to a back-end block of a Class-A power amplifier;
   b) operatively connecting a gain-control switching-network to a front-end block of the Class-A power amplifier;
   c) operatively connecting a detector-and-control block to an output of the back-end block of the Class-A power amplifier;
   d) processing a signal through the front-end block of the Class-A power amplifier followed by the back-end block of the Class-A power amplifier;
   e) sampling, by the detector-and-control block, a signal;
   f) comparing the signal with reference signals;
   g) determining switching configurations in the biasing-current switching-network and the gain-control switching-network;
   h) dynamically setting, by the biasing-current switching-network, a biasing current of the back-end block of the Class-A power amplifier to a highest possible operating efficiency; and
   i) simultaneously adjusting, by the gain-control switching-network, a gain of the front-end block of the Class-A power amplifier to synchronize with a dynamic-biasing current-switching configuration to allow an overall gain of the Class-A power amplifier to be constant in all biasing conditions.

* * * * *